United States Patent [19]

Walter

[11] 4,223,970

[45] Sep. 23, 1980

[54] COMPLIANT BACKPLANE ELECTRICAL CONNECTOR

[75] Inventor: Leo Walter, Palos Verdes Peninsula, Calif.

[73] Assignee: Electronics Stamping Corporation, Compton, Calif.

[21] Appl. No.: 15,450

[22] Filed: Feb. 26, 1979

[51] Int. Cl.³ .......... H05K 1/04

[52] U.S. Cl. .......... 339/17 C; 339/220 R

[58] Field of Search .......... 339/17 C, 220 R, 221 R, 339/221 M

[56] References Cited

U.S. PATENT DOCUMENTS

| | | | |
|---|---|---|---|
| 3,824,554 | 7/1974 | Shoholm | 339/221 R |
| 3,827,004 | 7/1974 | Vanden et al. | 339/221 R |
| 3,975,078 | 8/1976 | Ammon | 339/221 M |
| 4,017,143 | 4/1977 | Knowles | 339/221 R |

*Primary Examiner*—Roy Lake

*Assistant Examiner*—Eugene F. Desmond

*Attorney, Agent, or Firm*—William W. Haefliger

[57] ABSTRACT

A compliant electrical connector has a pin with edges to grip the boundary of a hole, the pin having at least one groove sunk in the side thereof so that the pin forms a flexure that flexes to reduce the cross sectional area of the groove as the pin is inserted into the hole.

11 Claims, 8 Drawing Figures

COMPLIANT BACKPLANE ELECTRICAL CONNECTOR

BACKGROUND OF THE INVENTION

This invention relates generally to the joining of electrical contacts or connectors to circuit boards, and more particularly concerns the construction of such contacts or connection to provide compliance or self-adjustment giving intimate contact with plating at a hole through the board, and enhancing reliability.

In the early days of computers, logic wiring was constantly changed, and thus the computer was "programmed" by plug-in wires called "patch cords", patching one component to another. These patch cords were located at the back or "back plane" of the computer. As transistors have advanced, and developed into a plurality of switches (gates, as they are called), logic is programmed into the computer by opening or closing said switches and gates. In this way, actual wiring is not physically disturbed. Subsequently, printed wiring boards carried the logic and memory components, with said wiring boards pluggable into "edge card connectors." Mounted on a "backplane", this is the same technology used to this day. However, the "backplane" still employs a plurality of posts, emanating from the back sides of the edge card connectors. These posts are wired by wire wrapping methods to program the computer, during manufacture. Program changes, and new programs are made by transistor switching. Further development of the "backplane" embodied the introduction of large, thicker printed wiring boards, with interconnecting circuits, to eliminate up to about 75% of wire wrap connections.

There are problems with this approach, for the posts from the connectors have to be soldered to the backplane, and mass wave soldering coats the connector posts with solder, thus making the subsequent wire wrap connections difficult and less reliable. Other mass soldering techniques cause severe warping of the entire backplane, due to high heat. This warpage creates severe reliability problems with the backplane connectors.

Attempts have been made to force-fit solid contact stems into the printed wiring backplane, through the holes previously used for soldered posts. This method works, but the printed-through holes have to be held to very close tolerances. Too large a hole gives a loose pin, with intermittent electrical contact, while a small hole is physically damaged by the tremendous force generated when the pin is forced in. Tight control of hole dimensions is effective, but costly.

One known connector provides a post that adjusts itself to various hole sizes. However it is violently overstressed when pressed into the plated hole, with reliability being about 98% good. The remaining 2% are good until thermal conditions create stress relaxation in the contact material and intermittent contact results (intermittency is the most troublesome fault). Another known compliant device operates like a spring "roll pin". This is effective but is costly to produce, and cannot be produced in close proximity to adjacent contacts, as much raw material is used to produce this device. Other known devices employ through slots in the center of the metal of the compliant section. Extensive testing shows that this approach is even less reliable than the first one, unless one starts to again limit the hole size. Accordingly, there is need for a highly reliable compliant pin, making good contact with plating at all temperatures.

SUMMARY OF THE INVENTION

It is a major object of the invention to provide a contact or connector which will overcome the problems and difficulties described above, and which is characterized by high reliability, low cost, and desired compliance.

Basically, the connector is adapted to be pressed endwise into a hole in a circuit board, and comprises:

(a) an axially elongated pin having edges to forcibly grip structure at the boundary of the hole as the pin is inserted into the hole, (b) the pin having at least one elongated groove sunk in the side thereof, the groove extending axially of the pin and configured to locally weaken the pin so that at least one flexure is formed by the pin to extend axially thereof adjacent the groove and along the groove length, (c) the flexure adapted to yieldably flex in response to insertion of the pin into the hole and progressive gripping of said structure by pin edges, thereby to reduce the cross sectional area of that groove in response to insertion of the pin into the hole.

As will be seen, two elongated grooves are typically sunk in opposite sides of the pin in such manner that a Z-shaped cross section is formed, with the flexure web located intermediate two spaced webs which define the corners or edges that grip the plating about the hole. The "Z" section, being now in a "concertina like" or bellows form, has become a spring, and like a bellows, it can be compressed inwardly, and due to its spring qualities, it will return to its stamped shape on removal of compressive forces. When deflected inwardly, by such action, energy is stored in the spring members, developing outwardly opposing forces against the walls of the hole. In application, the confining hole is plated in a backplane circuit board. Such holes typically have an electroplated layer of copper, and covering this, a layer of electroplated tin or tin/lead alloy.

When inserted into such a hole, the spring action of the contact section will create outwardly directed forced such that intimate electrical contact is made between the edges of the contact member, and the tin or tin/lead electroplating in the walls of the plated hole. Forces must be low enough that damage to the hole surface, or to the fiberglass substrate of the printed circuit board does not occur; yet, forces developed should be high enough to break through and penerate the surface oxides that form on the tin/tin lead plated surface (oxides are poor electrical conductors). Also, the entire contact pin must be held firmly in its inserted location, such that subsequent operations—wire wrapping—logic board interconnection etc., do not dislodge the contact or disturb the intimate electrical connection.

The invention has added advantages over other known types of compliant pin contacts in the fact that four edges are pressed against the walls of the hole. This gives great stability. It also gives a large surface of contact and the contacting edges are deployed fairly equally within the hole—thus stability is good in all directions.

Accordingly, the invention provides:

1. A contact that, by spring means, is compliant to fit into a plated hole.
2. A contact that is compliant sufficient to provide electrical contact with the plating in a plated hole.

3. A contact that, while compliantly fitting a plated hole, has rigid stability such that it cannot be displaced or disrupted unless a longitudinal force be applied to the contact in excess of about twelve pounds.
4. A contact that, while making good intimate electrical contact with a plated hole, has sufficient integrity to continue to make intimate contact at temperatures of up to 100° C. for 1,000 hours.
5. A contact that, when pressed into a correctly sized hole, will not be overstressed, or damaged to the degree that would jeopardize item 4 above.
6. A contact that will meet requirements 1-5 above regardless of the physical size of the plated hole, within the accepted normal limits of hole size variations common to commercial printed circuit board manufacturers.
7. A contact that, while meeting requirements one thru six, can be manufactured in a continuous strip, with spacing as small as 0.100 inches between formed contacts.

These and other objects and advantages of the invention, as well as the details of an illustrative embodiment, will be more fully understood from the following description and drawings, in which:

DRAWING DESCRIPTION

DETAILED DESCRIPTION

Figure 1:
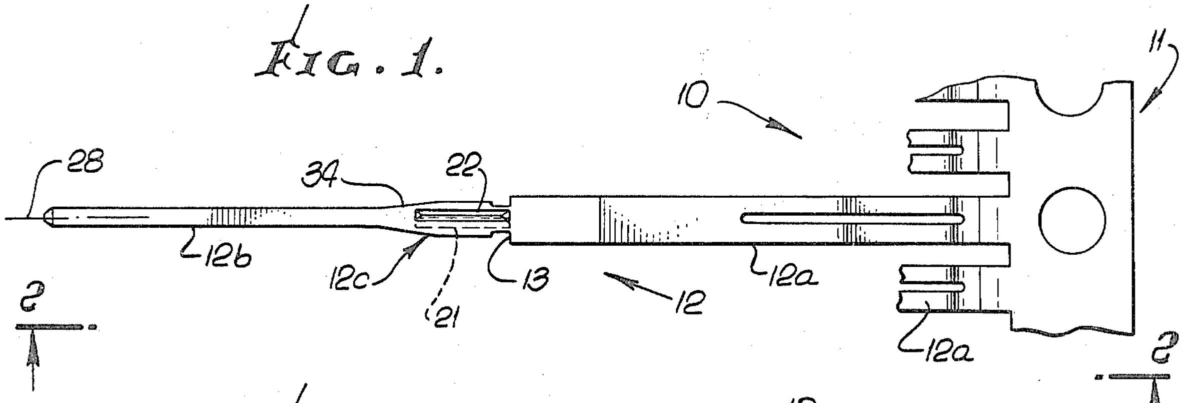
FIG. 1 is a plan view of a connector embodying the invention.
Figure 2:
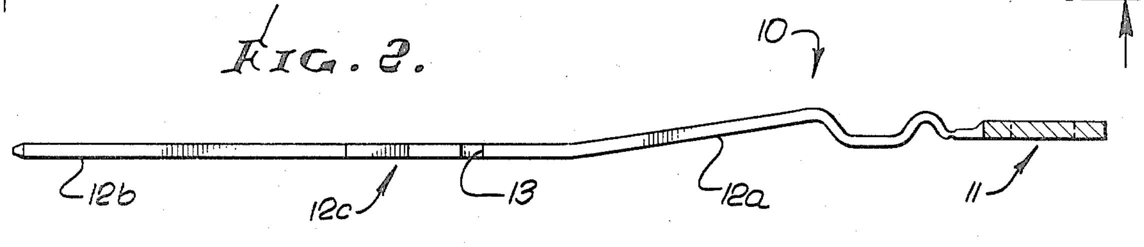
FIG. 2 is a side elevation taken on lines 2—2 of FIG. 1.

In FIGS. 1 and 2 the contact or connector 10 is shown to include a head portion 11 and an axially elongated pin 12. The latter includes a relatively wider section 12*a*, a wire-wrap post section 12*b*, and an intermediate section 12*c* joining the sections 12*a* and 12*b*. Section 12*a* may have the undulating form best seen in FIG. 2. Head 12 may comprise a bus or strip.

Figure 3:
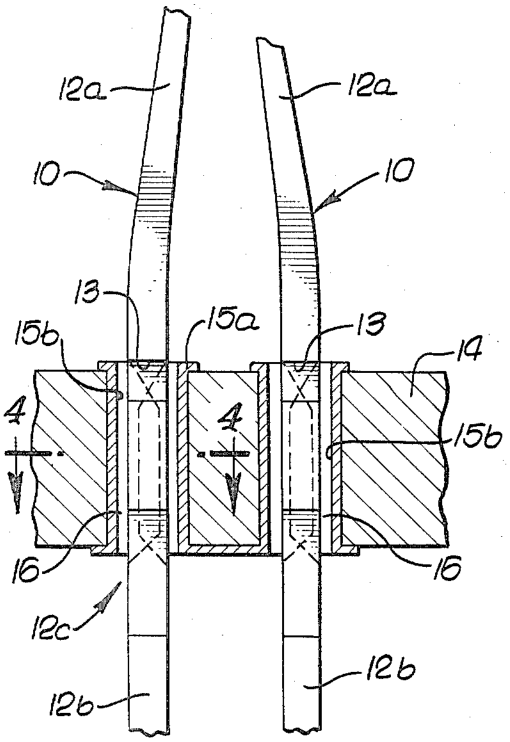
FIG. 3 is a vertical section showing a typical application of the FIG. 1 connector.

Step shoulder 13 formed at the junction of sections 12*a* and 12*c* is adapted to engage the printed circuit back plane board 14, or the plating 15*a* thereon, upon insertion of the connector into the board, thereby to limit such insertion. FIG. 3 shows two such connectors 10 inserted through openings or holes 16 the bores of which are plated at 15*b* with electrically conductive material.

Figure 4:
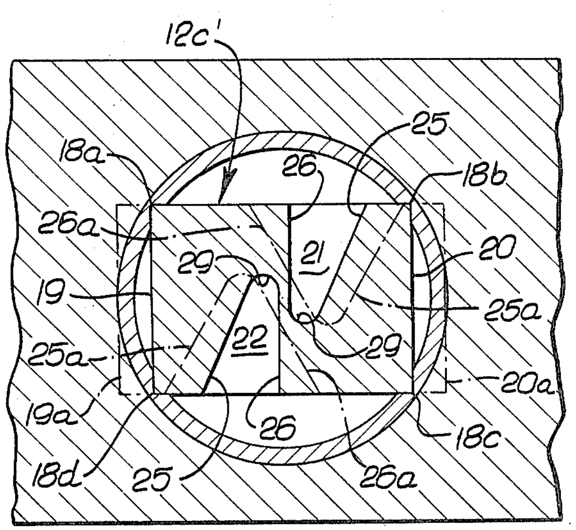
FIG. 4 is an enlarged section taken on lines 4—4 of FIG. 3.

In accordance with the invention, the pin has edges to forcibly grip the structure (as for example plating 15*b*) at the boundary of the hole as the pin is inserted into the hole. In the example shown in FIGS. 4-8, the pin section 12*c'* has four edges 18*a*, 18*b*, 18*c* and 18*d* at the corners of the generally rectangular cross section of the section 12*c*. Such edges penetrate the plating 15*b* upon insertion of the section 12*c* into the opening 16, and as will be explained, the section 12*c'* yieldably reduces in length so that the section end walls move from broken line positions 19*a* and 20*a* to the full line positions 19 and 20 indicated in FIG. 4.

Further in accordance with the invention, the pin has at least one elongated groove sunk in the side thereof, the groove extending axially of the pin and configured to locally weaken the pin so that at least one flexure is formed by the pin to extend axially thereof adjacent the groove and along the groove length. The flexure is adapted to yieldably flex in response to insertion of the pin into the hole, and in response to progressive gripping of the hole forming structure by the pin edges, thereby to reduce the cross sectional area of groove in response to insertion of the pin into the hole.

In the example, two such grooves 21 and 22 are sunk in opposite sides 23 and 24 respectively of section 12*c*, giving the cross section a Z-shape. Each groove has opposite side walls 25 and 26 forming generally V-shaped groove cross sections along major extent of the groove, and in planes normal to the pin axis 28. Also, the bottoms of the grooves are concavely rounded as at 29. The depth of each groove is such as to accommodate relative movement of the walls 25 and 26 toward one another in response to insertion of the pin into the hole. In this regard note the broken line wall positions 25*a* and 26*a* in FIG. 4, prior to such insertion. Note in FIG. 4 that the full depth of each groove is greater than $\frac{1}{2}$ the thickness of the section 12*c* between sides 23 and 24, but less than $\frac{3}{4}$ that thickness, for best results.

Figure 5:
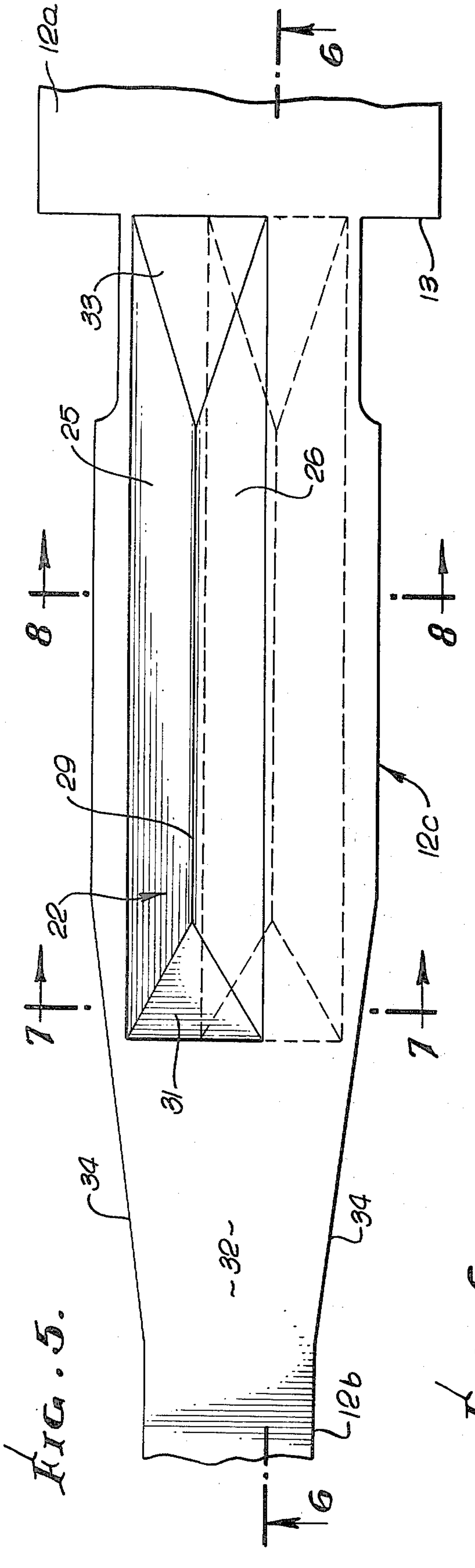
FIG. 5 is an enlarged fragmentary side view of the grooved portion of the FIG. 1 connector pin.
Figure 6:
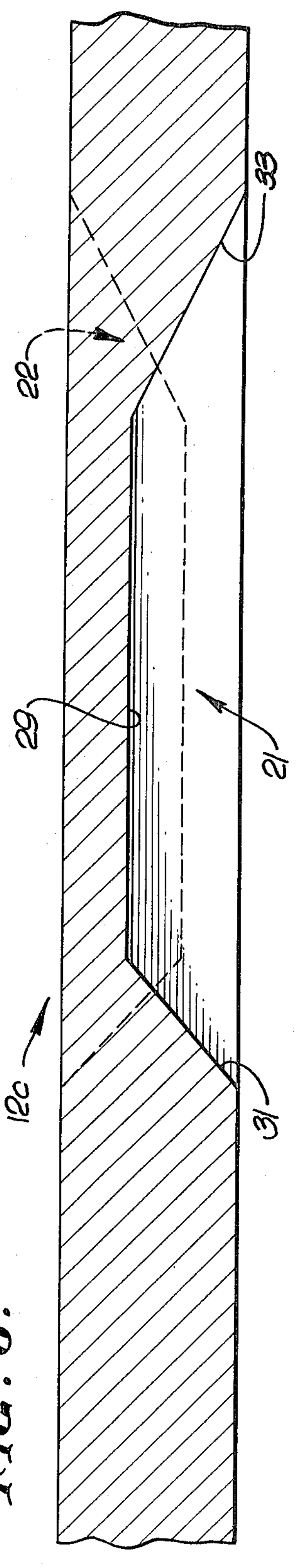
FIG. 6 is a side elevation taken on lines 6—6 of FIG. 5.
Figure 8:
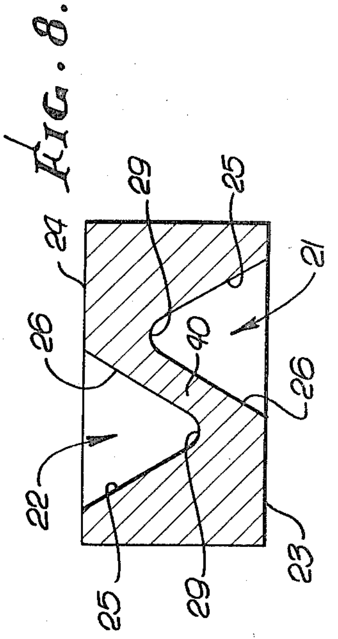
FIG. 8 is a section taken on lines 8—8 of FIG. 5.
Figure 7:
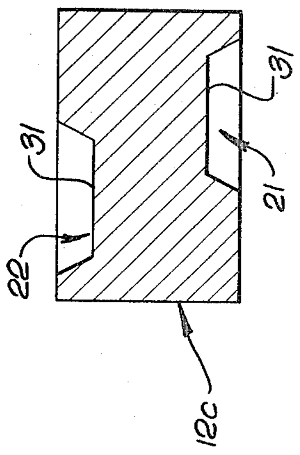
FIG. 7 is a section taken on lines 7—7 of FIG. 5.

FIGS. 5 and 7 show that the groove depth progressively increases along the flat triangular groove bottom wall 31 between the flat outer surface 32 and the full groove depth 29, at one end of the groove; likewise, at the opposite end of the groove, the depth progressively increase along the flat triangular groove bottom wall 33 between the transverse plane of shoulder 13 and the full groove depth. These geometries are the same for both grooves 21 and 22.

Ease of entry to prevent sudden disruption of a hole surface is thereby achieved in two ways with this design: the profile shape of the compliant section provides a "lead in", and the leading ends of the grooves making the bellows shape, and angled to allow deflection to occur progressively. In this regard, too obtuse an angle between groove walls 25 and 26 would overstress the metal during manufacture, and could cause fracture of the metal, while too sharp an angle would fail to develop forces that act throughout the length of the hole. The flexure is formed at 40 between the two grooves.

Accordingly, the advantages described above, and also having to do with yieldable transverse contraction of the pin section 12*c* cross section (enabling progressive edge penetration of the plating material 15*b*) are most advantageously realized through the pin construction as described. Note also the gradual taper at 34 of the pin lead in from wire-wrap section 12*b* to section 12*c*.

The spring action of the present design provides sufficient developed force to allow for, and compensate for, some loss of strength that occurs in any spring. Loss of strength is caused by heat and time, such losses being approximately the same for low heat/long time and for high heat/short time. Computers normally get hot, but are cooled by mechanical means to approximately to 50° C. At this temperature, 10 to 15% of a spring force is lost after 1,000 hours. Therefore, one must provide an initial surplus of force, so that there is still an adequate residual force over the lifetime of the product. Such stress relaxation is not linear, and is to some degree self limiting. The force/area ratio, (i.e. pressure) involved with this design is such that loss of 15% of the force gives only a very small drop in pressure.

I claim:

1. In a compliant electrical connector adapted to be pressed into a hole formed by surrounding structure, the combination comprising (a) an axially elongated pin having edges to forcibly grip said structure at the boundary of the hole as the pin is inserted into the hole, (b) the pin having first and second elongated grooves respectively sunk in opposite sides thereof, the full depth of each groove along a substantial portion of its length being greater than one-half the thickness of the section between said opposite sides of the pin, the grooves extending axially of the pin and configured to locally weaken the pin so that at least one flexure is formed by the pin to extend axially thereof between and adjacent the grooves and along the groove length, (c) the flexure adapted to yieldably flex in response to insertion of the pin into the hole and progressive gripping of said structure by pin edges, thereby to reduce the cross sectional area of that groove in response to insertion of the pin into the hole.

2. The connector of claim 1 wherein the depth of each groove progressively increases along one end portion of the groove.

3. The connector of claim 1 wherein at least one of said grooves has side walls forming generally V-shaped cross sections along major extent of the groove and in planes normal to said axis, the depth of the groove accommodating relative movement of said walls toward one another in response to said insertion of the pin into said hole.

4. The connector of claim 1 wherein the two grooves open outwardly at generally opposite sides of the pin.

5. The connector of claim 4 wherein the depths of said grooves in the pin progressively increase along corresponding end portions of the two grooves.

6. The connector of claim 5 wherein each groove has side walls forming generally V-shaped cross section along major extent of each groove and in planes normal to said axis, the depths of the grooves accommodating relative movement of walls of each groove relatively toward one another in response to said insertion of the pin into the hole.

7. The connector of claim 1 wherein the pin has a Z-shaped cross section at the locus of said grooves.

8. The connector of claim 1 including said structure forming said hole into which the pin is received.

9. The connector of claim 8 wherein said structure includes an electrically conductive plating material bounding said hole and penetrated by said pin edges, the pin having a generally polygonal overall external cross section.

10. In a compliant electrical connector adapted to be pressed into a hole formed by surrounding structure, the combination comprising (a) an axially elongated pin having edges to forcibly grip said structure at the boundary of the hole as the pin is inserted into the hole, (b) the pin having two grooves with predetermined cross-sectional areas sunk respectively in generally opposite sides thereof, the pin also having end walls spaced apart in a first lateral direction, the grooves extending axially of the pin and in such lateral relation that an axially elogated flexure is formed intermediate the two grooves, the grooves being relatively staggered in said first lateral direction so that the deepest portion of one groove is closer to one of said end walls than the other end wall, and the deepest portion of the other groove is closer to said other end wall than said one end wall, (c) the flexure adapted to yieldably flex in response to insertion of the pin into the hole and progressive gripping of said structure by pin edges, thereby to simultaneously reduce the cross sectional areas of the two grooves in response to insertion of the pin into the hole.

11. The connector of claim 10 wherein the pin also has a wire-wrap section beyond one end of said grooves, and an enlarged cross-section beyond the opposite end of said grooves.

* * * * *